United States Patent [19]
Hirataka et al.

[11] Patent Number: 5,675,684
[45] Date of Patent: Oct. 7, 1997

[54] OPTICAL MODULE HAVING SEMICONDUCTOR ELEMENTS FIXEDLY MOUNTED THEREON WITH IMPROVED ACCURACY

[75] Inventors: Toshinori Hirataka, Ome; Satoru Kikuchi, Kokubunji, both of Japan

[73] Assignee: Hitachi, Ltd., Tokyo, Japan

[21] Appl. No.: 588,704

[22] Filed: Jan. 19, 1996

[30] Foreign Application Priority Data

Jan. 23, 1995 [JP] Japan ................................ 7-007893

[51] Int. Cl.$^6$ .................................................. G02B 6/36
[52] U.S. Cl. .................................. 385/88; 385/91; 385/92
[58] Field of Search ......................... 385/88–94; 257/93, 257/99

[56] References Cited

U.S. PATENT DOCUMENTS

| | | | |
|---|---|---|---|
| 5,283,446 | 2/1994 | Tanisawa | 257/433 |
| 5,420,953 | 5/1995 | Boudreau et al. | 385/88 |
| 5,446,814 | 8/1995 | Kuo et al. | 385/88 X |
| 5,475,775 | 12/1995 | Kragl et al. | 385/88 X |

FOREIGN PATENT DOCUMENTS

| | | |
|---|---|---|
| 0 465 230 A2 | 1/1992 | European Pat. Off. . |
| 0 522 417 A1 | 1/1993 | European Pat. Off. . |
| 05029387 | 2/1993 | European Pat. Off. . |
| 55-52250 | 4/1980 | Japan . |
| 63-143890 | 6/1988 | Japan . |
| WO 93/15424 | 8/1993 | WIPO . |

OTHER PUBLICATIONS

"Self–Aligned Optical Flip–Chip OEIC Packaging Technologies", W. Hunziker, et al, Instiutute of Quantum Electronics, Swiss Federal Institute of Technology, ETH Hoenggerberg, CH–8093 Zurich, Switzerland, pp. 84–91 Dec. 9, 1993.

*Primary Examiner*—Phan T. H. Palmer
*Attorney, Agent, or Firm*—Antonelli, Terry, Stout & Kraus, LLP

[57] ABSTRACT

In order to position an optical semiconductor chip with high accuracy and without adjustment, a recess for controlling the displacement of the optical semiconductor chip is formed in a position in which the optical semiconductor chip on an optical element mounting substrate having an optical waveguide formed in the surface thereof is fixed.

48 Claims, 11 Drawing Sheets

OPTICAL MODULE HAVING SEMICONDUCTOR ELEMENTS FIXEDLY MOUNTED THEREON WITH IMPROVED ACCURACY

BACKGROUND OF THE INVENTION

The present invention relates to an improvement of the accuracy for fixedly mounting optical semiconductor elements or chips onto an optical platform in an optical semiconductor module.

An optical semiconductor module is a basic device which includes an optical communication system having a laser diode (LD) which is a light emitting element or chip or a photodiode (PD) which is a photodetector, an optical fiber, a lens for optically coupling therebetween, and a housing for fixedly mounting them. The optical communication system is mainly applied to a trunk line heretofore and increase of high-speed operation and a transmission distance has been performed. Hereafter, the optical communication system begins to study not only application to only the trunk line but also application to a local area network (LAN) in a building and a subscriber system for use in homes.

In the optical communication system used by such wider users, not only function and performance of the large-capacity trunk line but also reduction in cost of devices constituting the system are strongly desired. Accordingly, in a conventional method in which alignment of an optical axis is made and optical semiconductor chips are fixedly mounted on a mounting platform to be coupled with optical waveguides or optical fibers, since much time and labor are required in order to couple the optical semiconductor chips with the optical waveguides or the optical fibers with high accuracy, the mass productivity is deteriorated and the low cost is difficult.

Figure 5A:
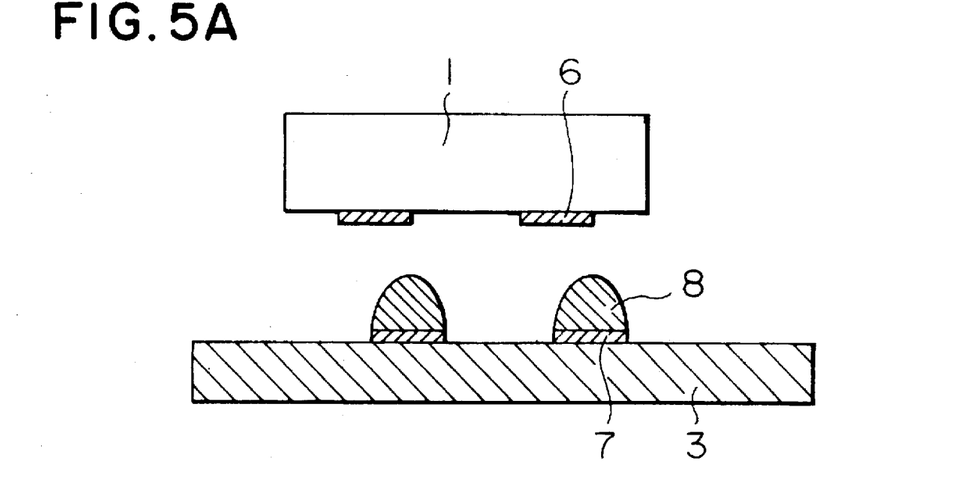
FIGS. 5A to 5C illustrate coupling of an optical semiconductor chip and an optical platform by means of solder bumps.
Figure 5B:
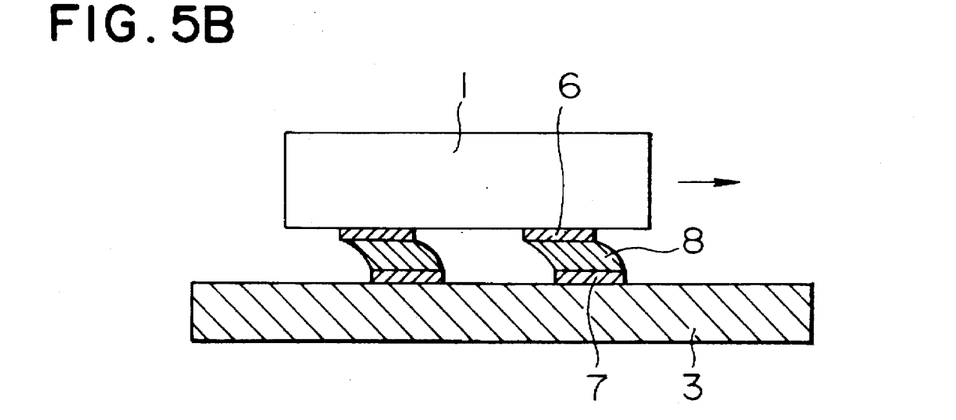
Figure 5C:
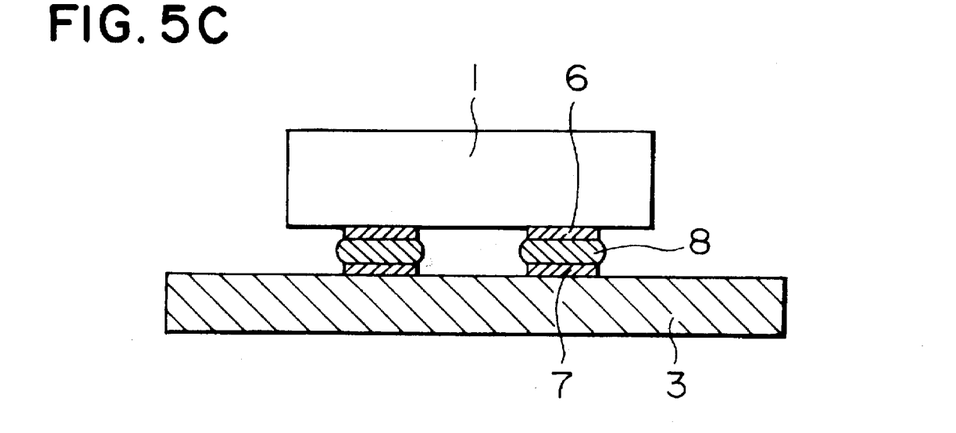

A structure for coupling an optical semiconductor chip with an optical waveguide or an optical fiber with high accuracy which utilizes solder bumps is shown in FIG. 5(a)–(c). In this structure, an electrode pattern 7 of metal film is formed on an optical element mounting platform 3, and another electrode pattern 6 of metal film is formed on a rear side of an optical semiconductor chip 1 so that the electrode pattern 6 conforms to the electrode pattern 7. The optical semiconductor chip 1 is thus disposed on the mounting platform 3 so that the electrode patterns 6 and 7 are substantially coincident with each other, and the electrode patterns 6 and 7 are joined with solder bumps 8. At this time, by previously forming the electrode pattern 7 on the mounting platform 3 in a position where optical semiconductor chips are optically coupled with optical waveguides or optical fibers when the optical semiconductor chips 1 are joined, the self-alignment effect acts due to the surface tension of the solder bump itself upon melting of the solder bump 8 as shown in FIG. 5(b), so that the electrode patterns 6 and 7 can be positioned with high accuracy and be optically coupled with each other without any adjustment. Thus, the optical semiconductor chips can be coupled with the optical waveguides or the optical fibers without any adjustment and accordingly improvement of the productivity of the optical semiconductor device can be expected.

SUMMARY OF THE INVENTION

There occurs a phenomenon that electrode patterns to be joined are not joined to each other or that electrode patterns are joined to adjacent electrode patterns or that electrode patterns do not quite come into contact with a solder bump, if the optical semiconductor chips are not placed on the optical element mounting platform upon melting of the solder bump with a positional accuracy of about 20 µm, depending on the size and number of the electrode patterns in order to position the optical semiconductor chips with high accuracy by utilizing the self-alignment effect. Accordingly, there occurs a problem that the optical semiconductor chips are made to deviate from a position in which the optical semiconductor chips are optically coupled with optical waveguides or optical fibers and are joined to the deviated position, or the optical semiconductor chips are not quite joined to the electrode patterns on the optical element mounting platform.

In order to solve the above problem, an optical module of the present invention comprises an optical element mounting substrate in which an optical waveguide is formed, an optical semiconductor element fixedly mounted in the optical element mounting substrate, and a recess for fixing the optical semiconductor element in a position in a surface of the optical element mounting substrate in which an end surface of an active layer of the optical semiconductor element and an end surface of the optical waveguide are coupled optically, and the alignment of the optical semiconductor element is made by means of the sides of the recess.

Further, an optical module of the present invention comprises an optical element mounting substrate in which a groove is formed, an optical fiber fixedly mounted in the groove, an optical semiconductor element fixedly mounted in the optical element mounting substrate, and an recess for fixing the optical semiconductor element in a position in a surface of the optical element mounting substrate in which an end surface of an active layer of the optical semiconductor element and an end surface of the optical fiber are coupled optically, and the alignment of the optical semiconductor element is made by means of the sides of the recess.

Furthermore, an optical module of the present invention comprises a plurality of optical semiconductor elements fixedly mounted on an optical element mounting substrate, and recesses each formed in a position in which end surfaces of active layers of the plurality of optical semiconductor elements are optically coupled with each other, and the alignment of the optical semiconductor elements is made by means of the sides of the recesses.

Further, in an optical module of the present invention, the recess comprises an electrode pattern for fixedly joining solder bumps.

In addition, in an optical module of the present invention, an electrode is formed in the side of the recess and this electrode is joined to an external electrode.

In an optical module of the present invention, a depth of the recess is 10 to 50 µm.

Further, in an optical module of the present invention, the sides of the recess are formed obliquely and an area of an opening thereof is larger than an area of the bottom.

Furthermore, in an optical module of the present invention, an antireflection film is provided in the side of the recess.

In addition, in an optical module of the present invention, the optical element mounting substrate is made of semiconductor material and the sides of the recess is constituted by {111} surface.

In an optical module of the present invention, a length and a breadth of the bottom of the recess are larger than a length and a breadth of the optical semiconductor element, respectively, and is narrower than respective values obtained by adding 60 µm to the length and the breadth of the optical semiconductor element, respectively.

Further, in an optical module of the present invention, the recess surrounds at least all corners of the surface of the optical semiconductor element opposite to the optical element mounting substrate.

Furthermore, in an optical module of the present invention, the recess surrounds at least all sides of the surface of the optical semiconductor element opposite to the optical element mounting substrate.

In addition, in an optical module of the present invention, the recess surrounds at least a set of opposite corners of the surface of the optical semiconductor element opposite to the optical element mounting substrate.

In an optical module of the present invention, the recess surrounds at least corners at both ends of any one side of the surface of the optical semiconductor element opposite to the optical element mounting substrate and another side opposite to said one side.

In an optical module of the present invention, the optical semiconductor element comprises a photodiode or a laser diode.

According to the present invention, the recess is formed in the position in which the optical semiconductor element on the optical element mounting substrate is fixedly joined to thereby be able to fixedly join the optical semiconductor element in a desired position without adjustment.

Further, since the sides of the recess is formed obliquely so that an area of an opening of the recess is larger than an area of the bottom to thereby be able to reduce an amount of reflected light which is returned to the optical semiconductor element, the characteristics of the optical semiconductor element can be prevented from being scattered due to the reflected light. In addition, the obliquely formed sides of the recess is suitable for connection of the optical semiconductor element joined on the optical element mounting substrate and the electrode formed externally.

Furthermore, by forming a depth of the recess to 10 to 50 μm, the depth of the recess is deeper than the height of the unmelted solder bump and accordingly after the optical semiconductor element is disposed on the mounting substrate, the displacement of the optical semiconductor element until the solder bump is melted can be limited. The mounting substrate and the optical semiconductor element can be joined with high accuracy by the self-alignment effect upon melting of the solder bump.

In addition, by forming the antireflection film or layer on the sides of the recess, the reflected light is not returned to the optical semiconductor element and accordingly deterioration of the characteristics of the optical semiconductor element due to the reflected light can be prevented.

Further, a plurality of recesses are formed on a wafer and an optical semiconductor element is mounted in each of the recesses. The wafer and the optical semiconductor elements are fixedly joined by solder bumps and the wafer is cut into chips to form optical modules to thereby be able to improve the mass productivity of the optical modules and attain the low-cost optical semiconductor device.

DESCRIPTION OF THE PREFERRED EMBODIMENTS

Figure 1A:
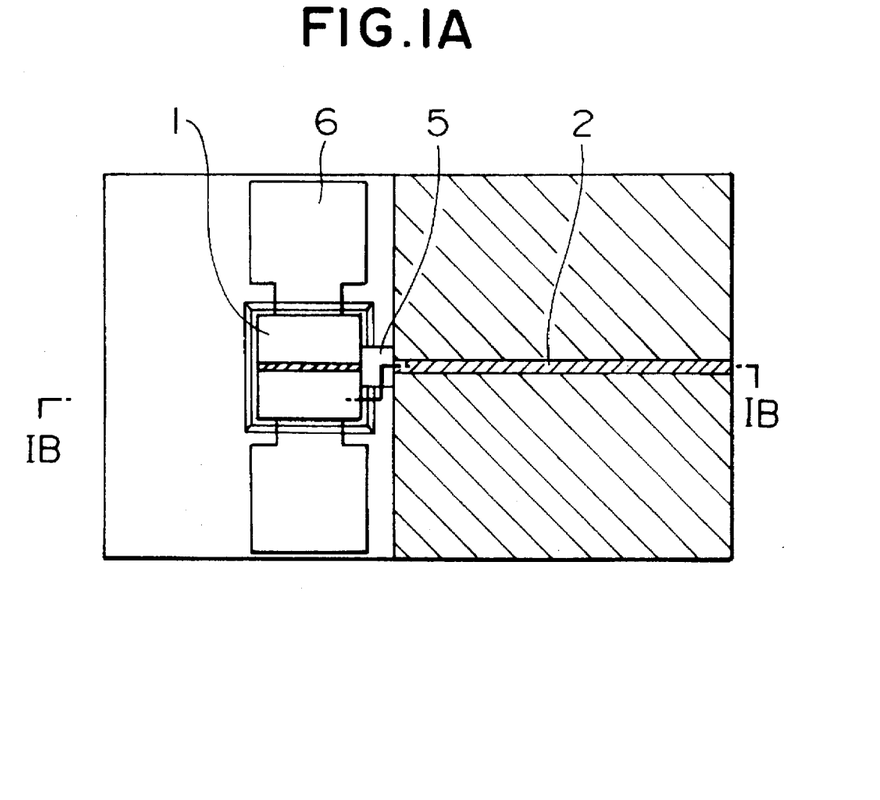
FIGS. 1A and 1B are schematic diagrams illustrating an optical module according to an embodiment of the present invention in which an optical semiconductor chip and an optical waveguide are coupled.
Figure 1B:
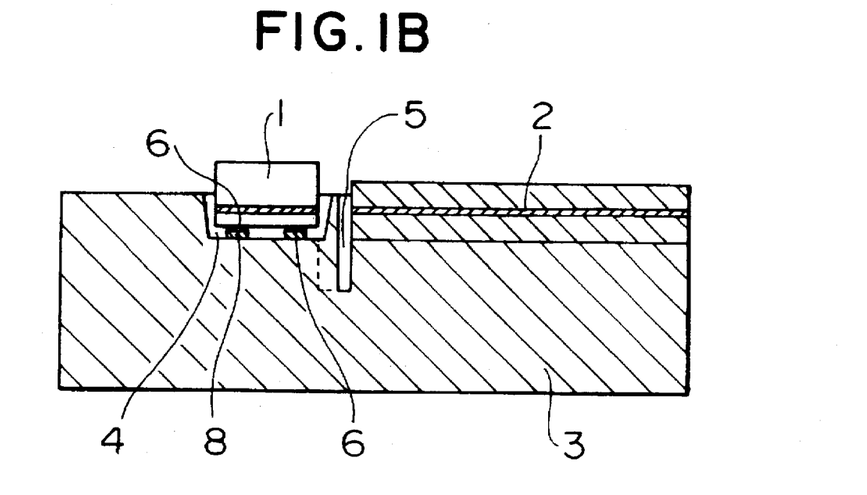

FIGS. 1A and 1B are schematic diagrams illustrating an embodiment of an optical module according to the present invention in which an optical semiconductor element or chip is coupled with an optical waveguide. FIG. 1A is a plan view and FIG. 1B is a sectional view taken along line A-B. In FIG. 1, an optical waveguide 2, an optical displacement avoiding groove 4 and an optical guide groove 5 are formed in the surface of an optical element mounting substrate or optical platform 3 made of a silicon substrate. A optical semiconductor chip 1 is fixedly mounted in the optical displacement avoiding groove 4 by means of solder bumps 8. With such a structure, since the displacement of the optical semiconductor chip 1 on the optical platform 3 can be limited, there does not occur a phenomenon that the optical semiconductor chip 1 is made to deviate before the solder bump 8 hardens so that electrode patterns 6 and 7 are not coupled with each other upon melting of the solder bump 8, nor is optical semiconductor chip 1 made to deviate from a position where the optical semiconductor chip 1 is optically coupled to the optical waveguide 2 and is joined to the deviated position or the optical semiconductor 1 is not quite joined fixedly. Accordingly, the electrode patterns 6 and 7 can be coupled with each other exactly.

A length and a breadth of a bottom of the optical displacement avoiding groove 4 are made larger than a length and a breadth of a bottom of the optical semiconductor chip 1 in consideration of a size and the number of the solder bumps, respectively, and are made narrower than respective values obtained by adding 60 μm to the length and the breadth of the bottom of the optical semiconductor chip 1, so that the displacement of the optical semiconductor chip 1 can be reduced to 30 μm or less and a phenomenon that the position of the optical semiconductor chip 1 is deviated too much so that the solder bumps and the electrode pattern which are not to be coupled with each other are coupled with each other can be avoided so that the electrode patterns 6 and 7 can be coupled with each other exactly.

Figure 10:
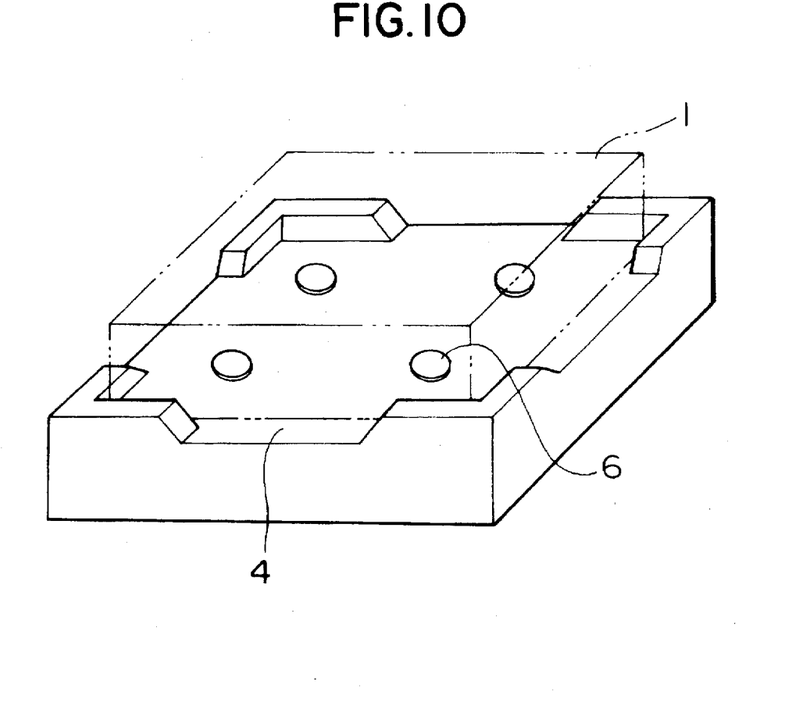
FIG. 10 illustrates a shape of a recess in an embodiment of the present invention.

Further, as shown in FIG. 10, even when the recess is formed to surround all corners of the surface of the optical semiconductor chip 1 opposite to the optical platform 3, the above effect can be obtained.

Figure 11:
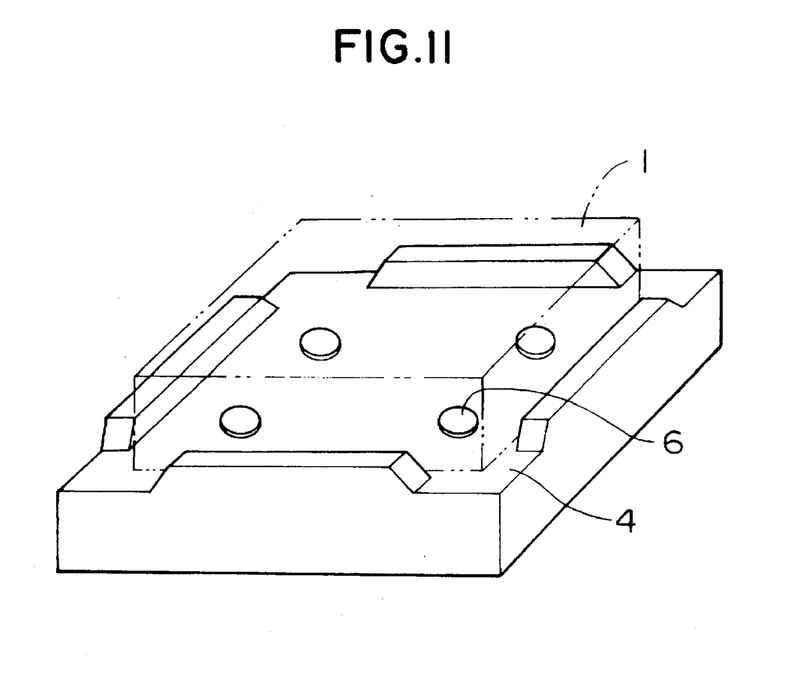
FIG. 11 illustrates a shape of a recess in an embodiment of the present invention.

Furthermore, as shown in FIG. 11, even when the recess is formed to surround all sides of the surface of the optical semiconductor chip 1 opposite to the optical platform 3, the above effect can be also attained.

Figure 12:
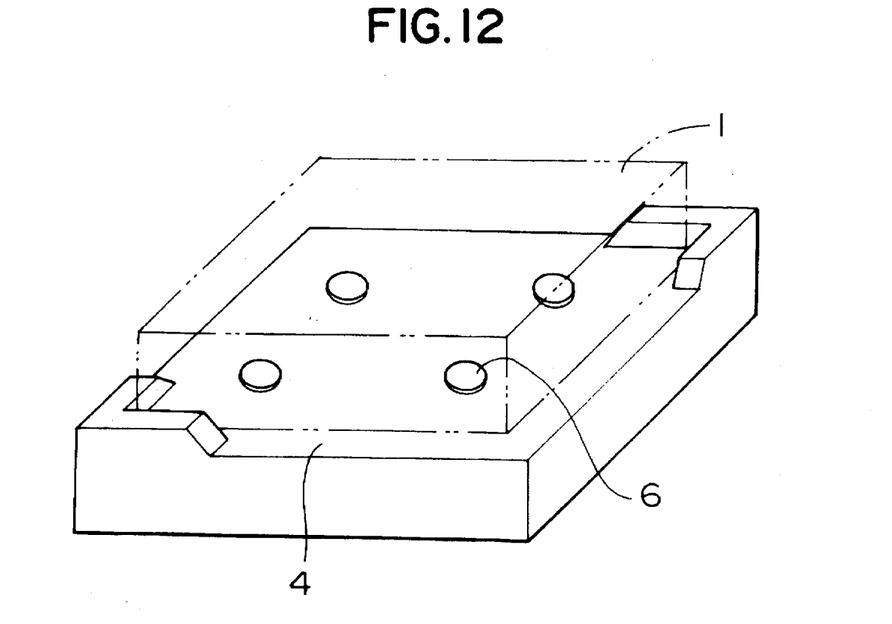
FIG. 12 illustrates a shape of a recess in an embodiment of the present invention.

In addition, as shown in FIG. 12, even when the recess is formed to surround a set of opposite corners of the surface of the optical semiconductor chip 1 opposite to the optical platform 3, the above effect can be obtained.

Figure 13:
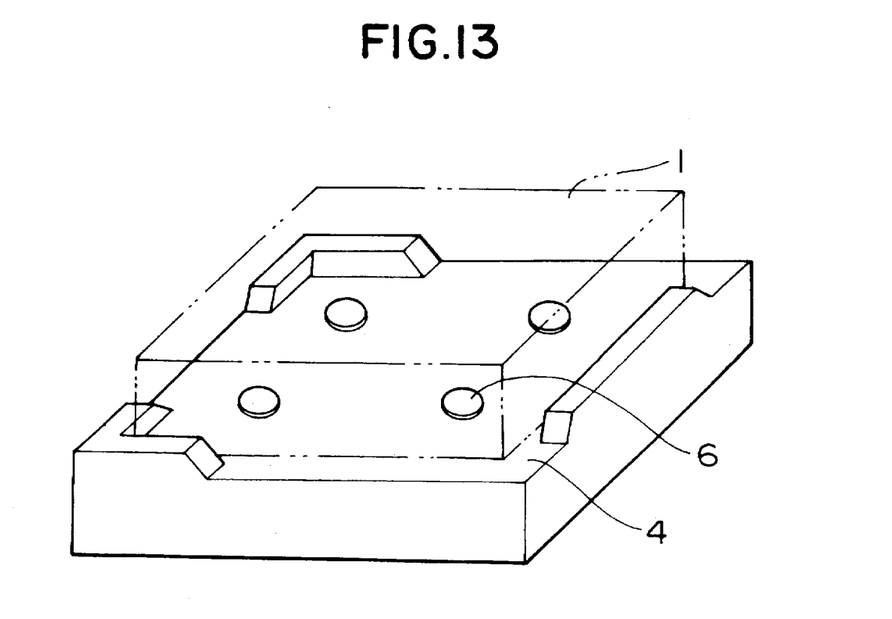
FIG. 13 illustrates a shape of a recess in an embodiment of the present invention.

Further, as shown in FIG. 13, even when the recess is formed to surround corners at both ends of any one side of the surface of the optical semiconductor chip 1 opposite to the optical platform 3 and another side of the optical semiconductor chip 1 opposite to the one side, the above effect can be obtained.

Figure 2A:
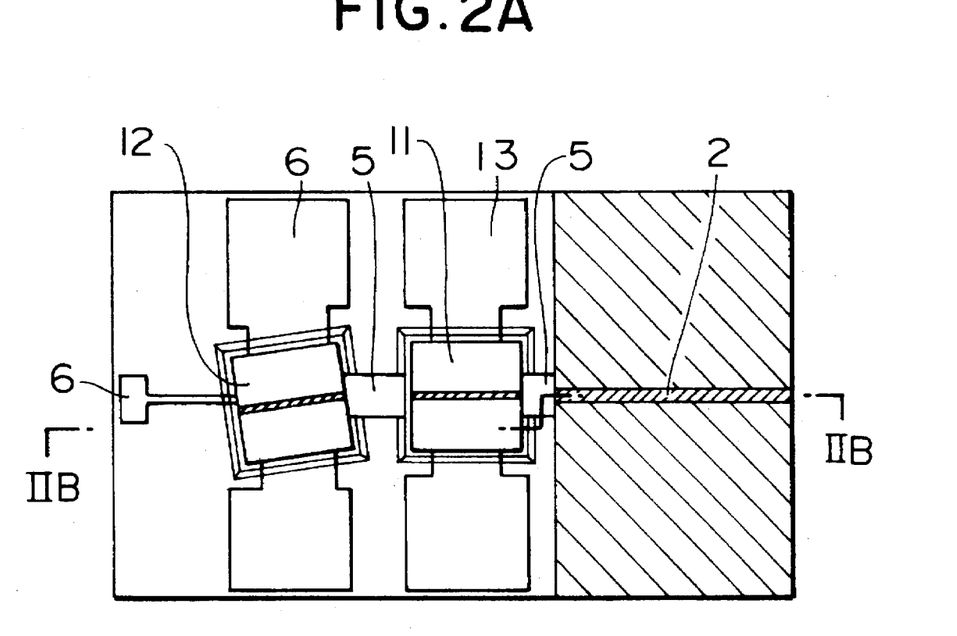
FIGS. 2A and 2B are schematic diagrams illustrating an optical module according to an embodiment of the present invention in which optical semiconductor chips and an optical waveguide are coupled.
Figure 2B:
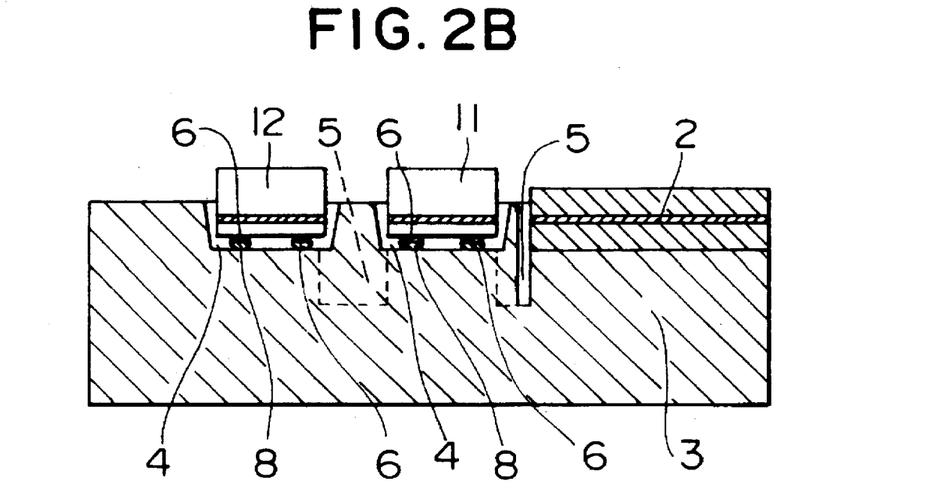

FIGS. 2A and 2B are schematic diagrams illustrating another embodiment of an optical module according to the present invention in which optical semiconductor chips and an optical waveguide are coupled. FIG. 2A is a plan view and FIG. 2B is a sectional view taken along line A-B. In FIG. 2, an optical waveguide 2, optical displacement avoiding grooves 4 and optical guide grooves 5 are formed in the surface of an optical platform 3 made of a silicon substrates, and a light emitting chip 11 and a photodetector 12 are fixedly mounted or joined in the respective optical displacement avoiding grooves 4 by means of solder bumps 8. The photodetector 12 is provided to monitor laser light emitted from the light emitting chip 11 and the reliability of the light emitting chip 11 can be compensated by monitoring the laser light by the photodetector 12.

In FIGS. 2A and 2B, the photodetector 12 is mounted on the optical platform 3 obliquely to the light emitting chip 11, so that light reflected by an end surface of the photodetector 12 can be prevented from being returned to the light emitting chip 11.

Figure 6:
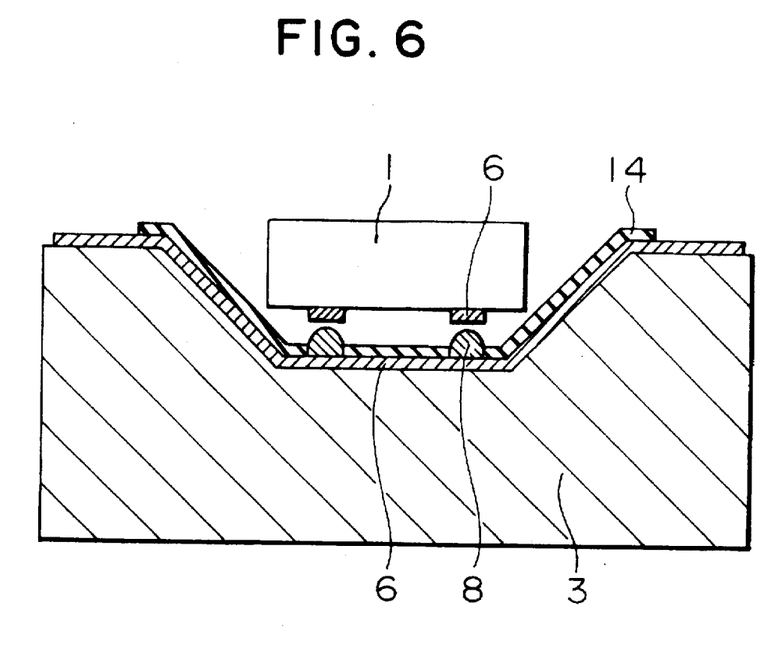
FIG. 6 illustrates electrodes formed in an optical displacement avoiding groove in an embodiment according to the present invention.
Figure 7:
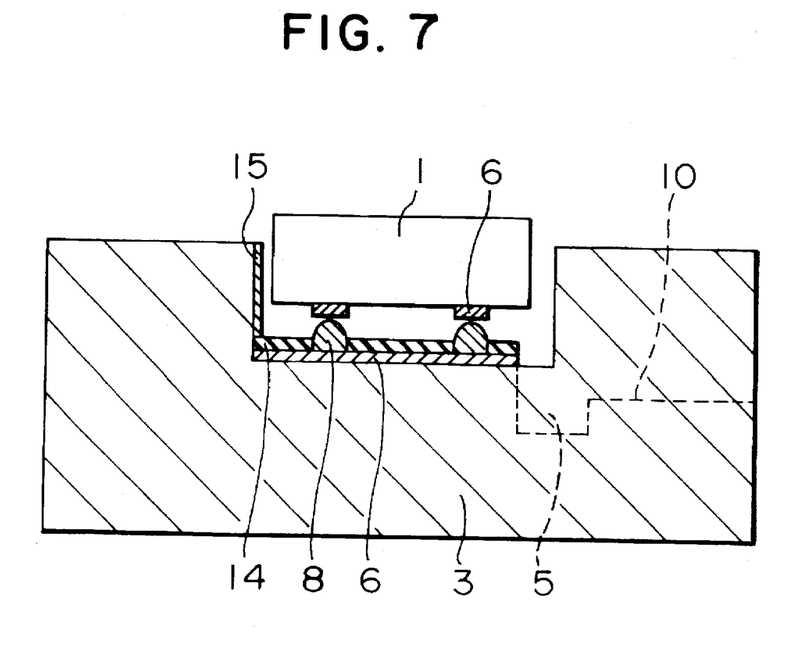
FIG. 7 illustrates an antireflection film formed in an optical displacement avoiding groove in an embodiment according to the present invention.

An example of a method for fabricating the optical module shown in FIGS. 1 and 2 is now described. A step is first formed in the optical platform 3 by means of etching and the optical waveguide 2 is formed by means of the flame hydrolysis deposition (FHD) and dry etching. Then, etching is performed to form the optical displacement avoiding groove 4 and the optical groove 5. As shown in FIGS. 6 and 7, an electrode 13 is formed and patterned from the inside to the outside of the optical displacement avoiding groove 4 by the evaporation method and oxide film formed on the electrode 13 is windowed by means of the CVD method to form the electrode patterns 6 and 7. Then, the optical semiconductor chip 1 or the light emitting chip 11 and the photodetector 12 having electrodes 6 formed on the rear side thereof and solder bumps 8 formed thereon are disposed in the optical displacement avoiding groove 4 and the solder bumps 8 are melted in a reflow furnace, so that the optical waveguide 2 and the optical semiconductor chip 1 or the light emitting chip 11 and the photodetector 12 are joined in the position in which they are coupled optically. As described above, the optical module of the present invention is completed.

In the above fabricating method, when the optical displacement avoiding groove 4 is formed, silicon is subjected to anisotrophy etching while a KOH aqueous solution is used as an etchant, so that side walls are inclined to be (111) surface as shown in FIG. 6. Accordingly, an area of an opening can be made larger than an area of the bottom. Further, since the sides of the optical displacement avoiding groove 4 for fixedly mounting or joining the optical semiconductor chip 1 and the light emitting chip 11 can be inclined to reduce reflected light, deterioration of the characteristic of the optical elements such as the optical semiconductor chip 1, the light emitting chip 11 and the photodetector 12 due to reflected light can be prevented. It is not necessary to incline the sides of the optical displacement avoiding groove 4 for fixedly mounting or joining the photodetector 12, since light emitted from the light emitting chip 11 and incident on the photodetector 12 does not reach the end surface of the photodetector 12 and accordingly reflected light which influences the characteristics of the light emitting chip 11 does not occur.

Furthermore, when the optical displacement avoiding groove 4 is formed by dry etching, resist used as an etching mask is previously dragged or flagged by hard baking so that side walls of the groove formed by etching are also dragged and accordingly the area of the opening can be easily made larger than that of the bottom.

In addition, as shown in FIG. 7, when the sides of the optical displacement avoiding groove 4 are formed vertically, an antireflection film or layer 15 is formed vertically to the optical path on the sides thereof to thereby be able to reduce reflection of laser light at the sides thereof. Accordingly, deterioration of the characteristics of the optical elements such as the optical semiconductor chip 1 and the light emitting chip 11 due to reflected light can be prevented.

Figure 3A:
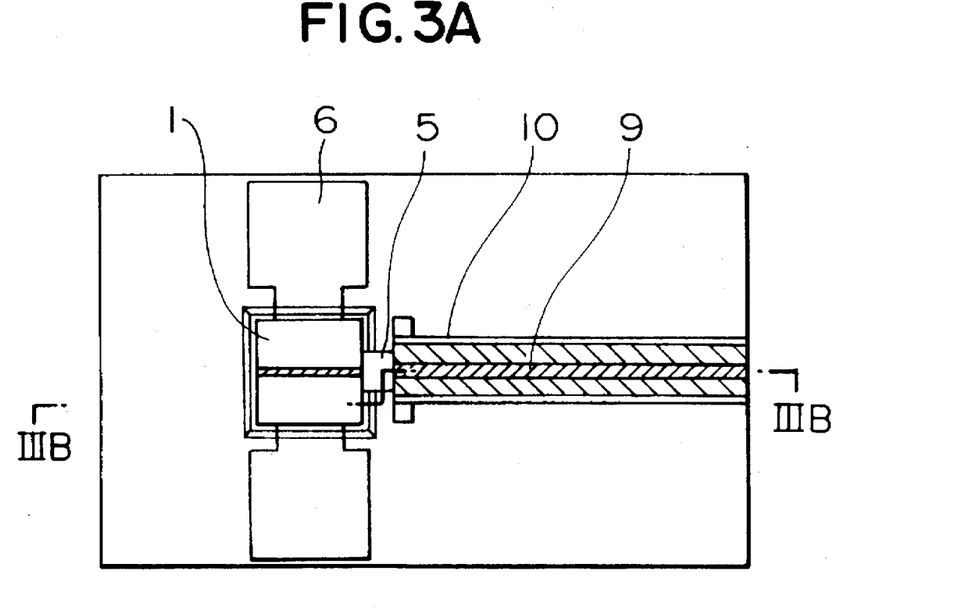
FIGS. 3A and 3B are schematic diagrams illustrating an optical module according to an embodiment of the present invention in which an optical semiconductor chip and an optical fiber are coupled.
Figure 3B:
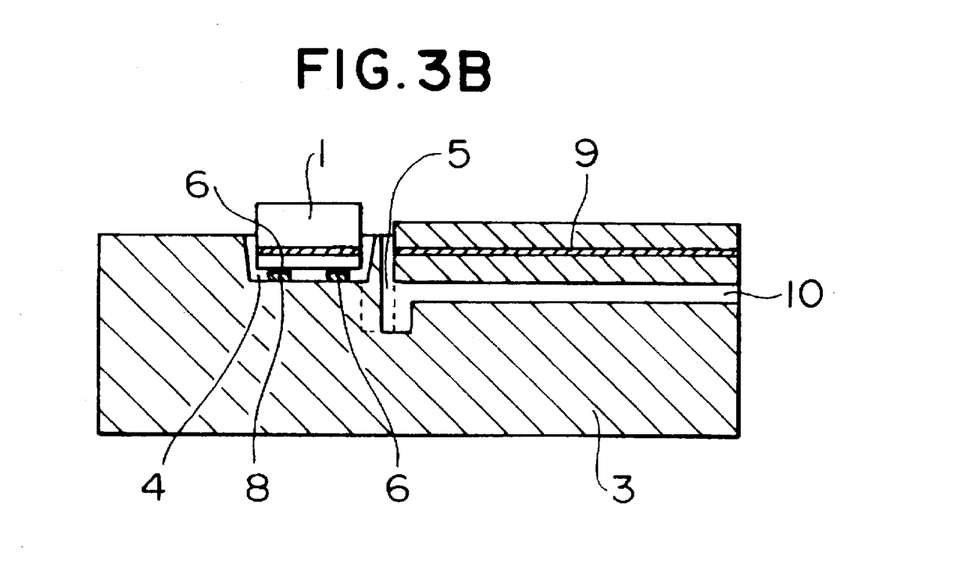

FIGS. 3A and 3B are schematic diagrams illustrating an embodiment of an optical module according to the present invention in which an optical semiconductor chip and an optical fiber 9 are coupled, and FIGS. 3A and 3B are a plan view and a sectional view taken along line A-B, respectively. A V-groove 10 for fixedly mounting or joining the optical fiber 9, an optical displacement avoiding groove 4 and an optical guide groove 5 are formed in the surface of an optical platform 3 made of a silicon substrate and an optical semiconductor chip 1 is fixedly mounted in the optical displacement avoiding groove 4 by means of solder bumps 8. With such a structure, since the displacement of the optical semiconductor chip 1 on the optical platform 3 can be limited, there does not occur phenomenon that the optical semiconductor chip 1 is deviated before the solder bumps 8 harden so that the electrode patterns 6 and 7 to be coupled upon melting of the solder bump 8 are not coupled or the optical semiconductor chip 1 is deviated from a position in which the optical semiconductor chip 1 is optically coupled with the optical fiber 9 and is joined to the deviated position or the optical semiconductor chip 1 is not quite joined, and accordingly the electrode patterns 6 and 7 can be coupled exactly.

Figure 4A:
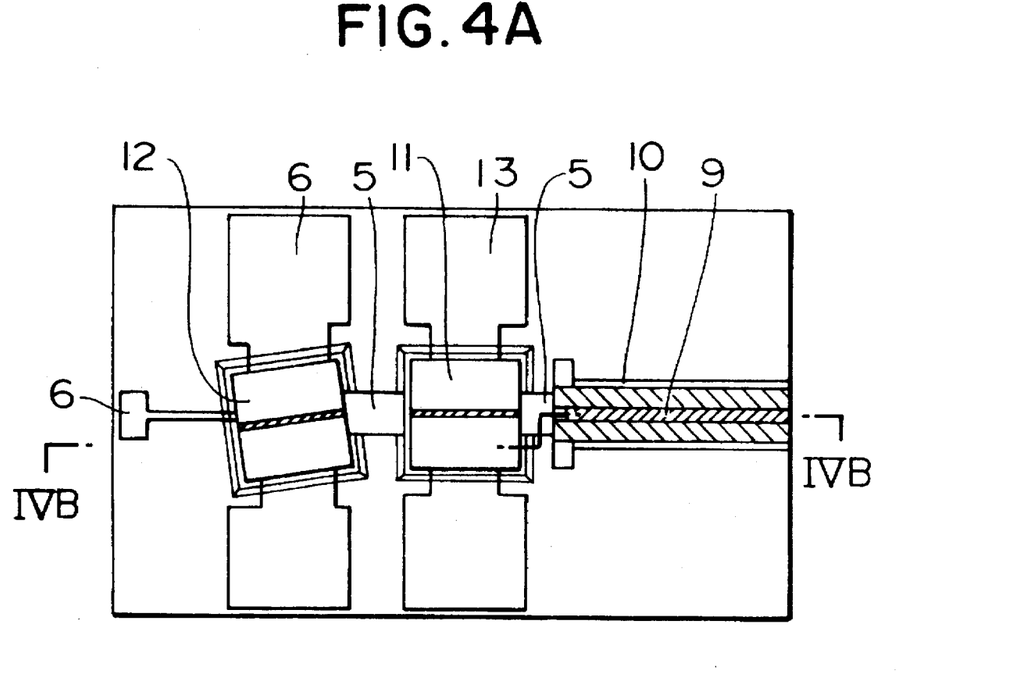
FIGS. 4A and 4B are schematic diagrams illustrating an optical module according to an embodiment of the present invention in which optical semiconductor chips and an optical fiber are coupled.
Figure 4B:
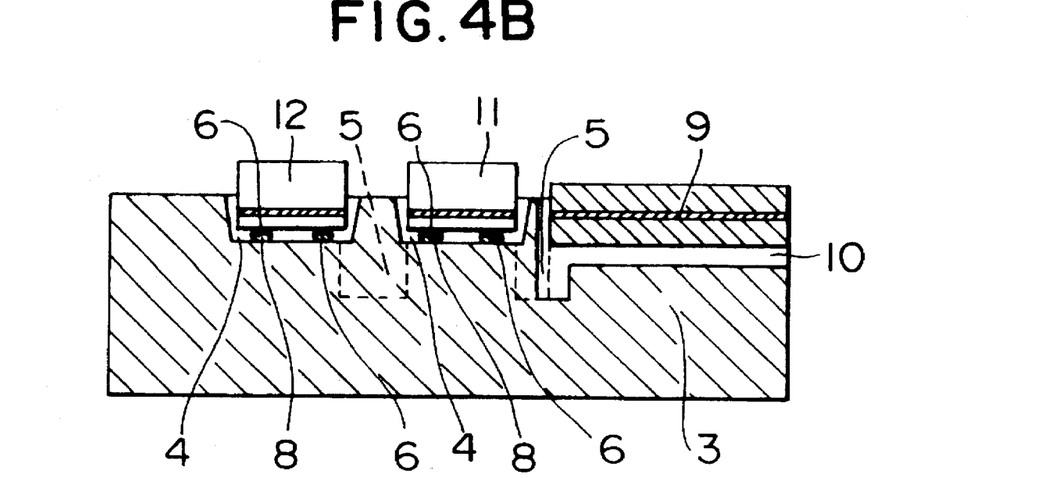

FIGS. 4A and 4B are schematic diagrams illustrating another embodiment of an optical module according to the present invention in which optical semiconductor chips and an optical fiber 9 are coupled, and FIGS. 4A and 4B are a plan view and a sectional view taken along line A-B, respectively. A V-groove 10 for fixedly mounting or joining the optical fiber 9, an optical displacement avoiding groove 4 and an optical guide groove 5 are formed in the surface of the optical platform 3 of a silicon substrate and a light emitting chip 11 and a photodetector 12 are fixedly mounted in the optical displacement avoiding groove 4 by means of the solder bump 8. The photodetector 12 is provided to monitor laser light emitted from the light emitting chip 11 and the reliability of the light emitting chip 11 can be compensated by monitoring the laser light by the photodetector 12.

With such a structure, since the displacement of the light emitting chip 11 and the photodetector 12 on the optical platform 3 can be limited, there does not occur phenomenon that the light emitting chip 11 and the photodetector 12 are deviated before the solder bumps 8 harden so that the electrode patterns 6 and 7 to be coupled upon melting of the solder bump 8 are not coupled or the light emitting chip 11 and the photodetector 12 are deviated from a position in which the light emitting chip 11 and the photodetector 12 are optically coupled with the optical fiber 9 and joined to the deviated position or the light emitting chip 11 and the photodetector 12 are not quite joined and accordingly the electrode patterns 6 and 7 can be coupled exactly.

Further, in FIG. 4, the photodetector 12 is joined on the optical platform 3 obliquely to the light emitting chip 11, so that light reflected at an end surface of the photodetector 12 can be prevented from be returned to the light emitting chip 11.

An example of a fabricating method of the optical module of the present invention shown in FIGS. 3 and 4 is now described. The V-groove having side walls constituted by (111) surface is first formed in the optical platform 3 by anisotrophy etching of silicon. Then, etching is performed to form the optical displacement avoiding groove 4 and the optical guide groove 5. As shown in FIG. 6, an electrode 13 is formed and patterned from the inside to the outside of the optical displacement avoiding groove 4 by the evaporation method and oxide film 14 formed on the electrode 13 is windowed by means of the CVD method to form the electrode patterns 6 and 7. Then, the optical semiconductor chip 1 or the light emitting chip 11 and the photodetector 12 having electrodes 6 formed on the rear side thereof and solder bumps 8 formed thereon are disposed in the optical displacement avoiding groove 4 and the solder bumps 8 are melted in a reflow furnace to join them. Then, the optical fiber 9 is fixedly mounted in the V-groove 9 with solder to thereby optically couple the optical semiconductor chip 1 with the optical fiber 9 or the light emitting chip 11 and the photodetector 12 with the optical fiber 9. As described above, the optical module of the present invention is completed.

In the above fabricating method, since the optical displacement avoiding groove 4 is formed to incline the sides thereof so that reflected light can be reduced, deterioration of the characteristics of the optical elements such as the optical semiconductor chip 1 and the LD chip 11 due to the reflected light can be prevented. It is not necessary to incline the sides of the optical displacement avoiding groove 4 for fixedly mounting or joining the photodetector 12 since light emitted by the light emitting chip 11 and incident on the photodetector 12 does not reach the end surface of the photodetector 12 and accordingly reflected light which influences the characteristics of the light emitting chip 11 is not produced.

Further, as shown in FIG. 7, when the sides of the optical displacement avoiding groove 4 are formed vertically, an antireflection film or layer 15 is formed vertically to the optical path at the sides to thereby be able to reduce reflection of laser light at the sides. Accordingly, deterioration of the characteristics of the optical elements such as the optical semiconductor chip 1 and the light emitting chip 11 due to reflected light can be prevented.

Figure 8:
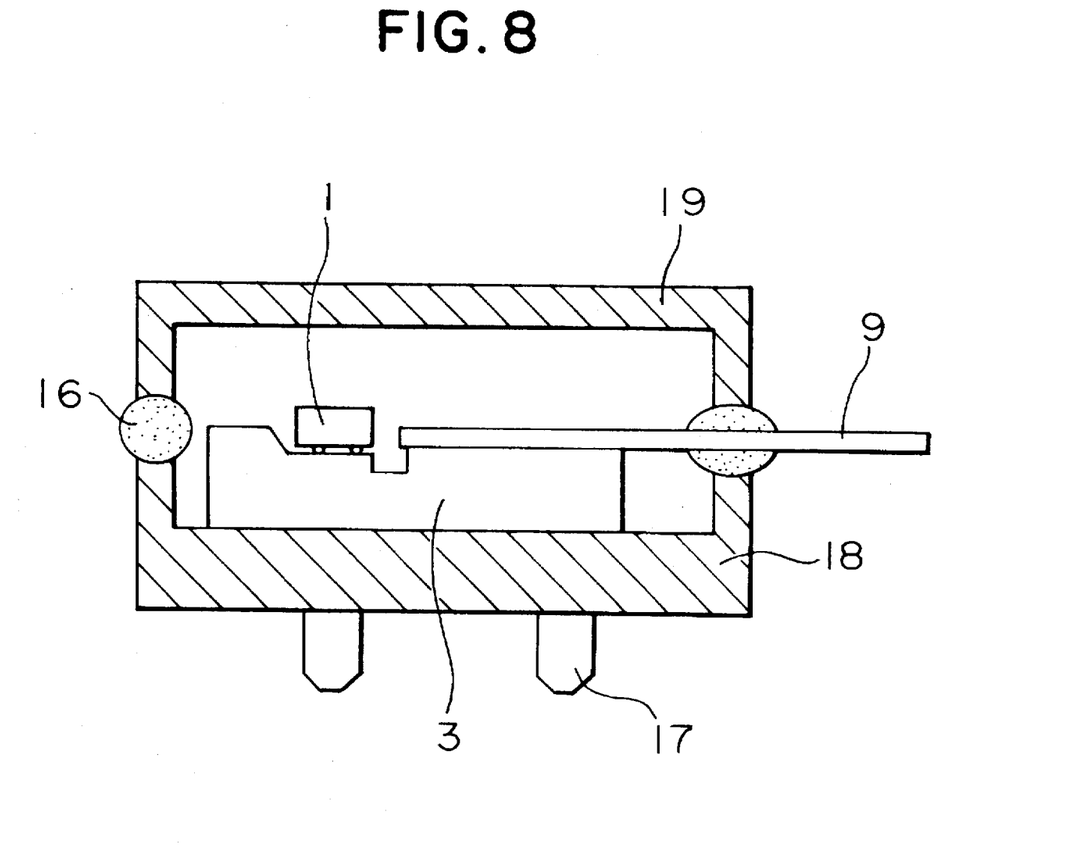
FIG. 8 schematically illustrates an optical semiconductor device including an optical module according to an embodiment of the present invention.

FIG. 8 is a schematic diagram illustrating an optical semiconductor device in which the optical module of the present invention is mounted. In FIG. 8, the optical platform 3 in which the optical semiconductor chip 1 is mounted is joined to a lower package 19 to which a lead frame 17 is formed. The electrode 13 on the optical platform 3 is then connected to the lead frame 17 by wire bonding. The optical fiber 9 is disposed in the V-groove on the mounting platform and fixed therein by adhesive agent or the like. Then, the upper package 18 is closely Joined to the lower package 19 by means of adhesive agent while maintaining the inside of the package to be an atmosphere of nitrogen. Thus, the optical semiconductor device having the optical module of the present invention mounted therein is completed.

Figure 9A:
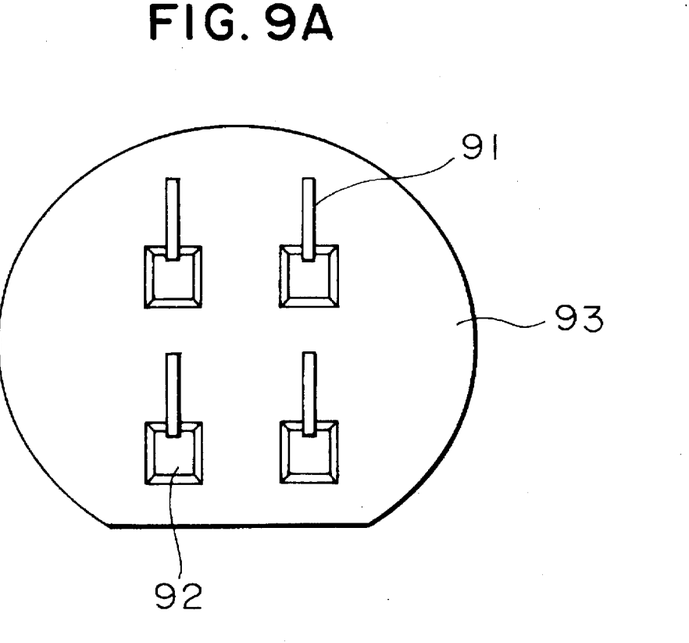
FIGS. 9A to 9D show a process of fabricating a plurality of optical modules according to an embodiment of the present invention simultaneously.
Figure 9B:
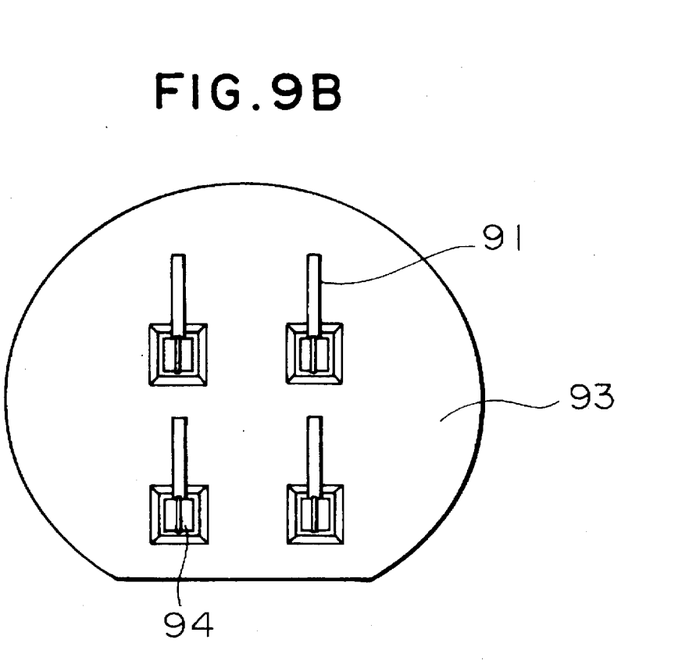
Figure 9C:
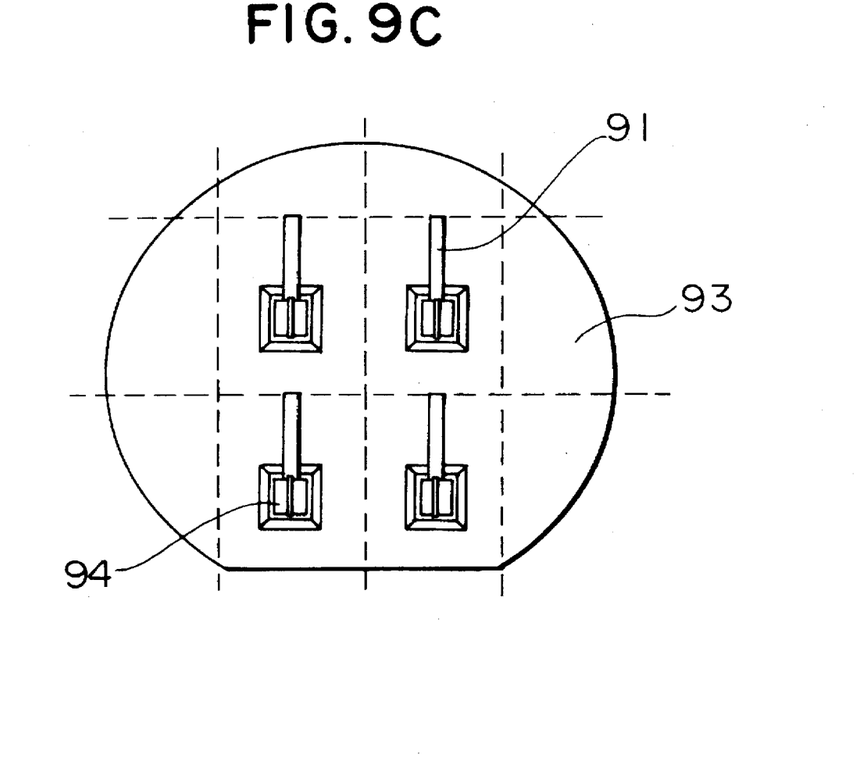
Figure 9D:
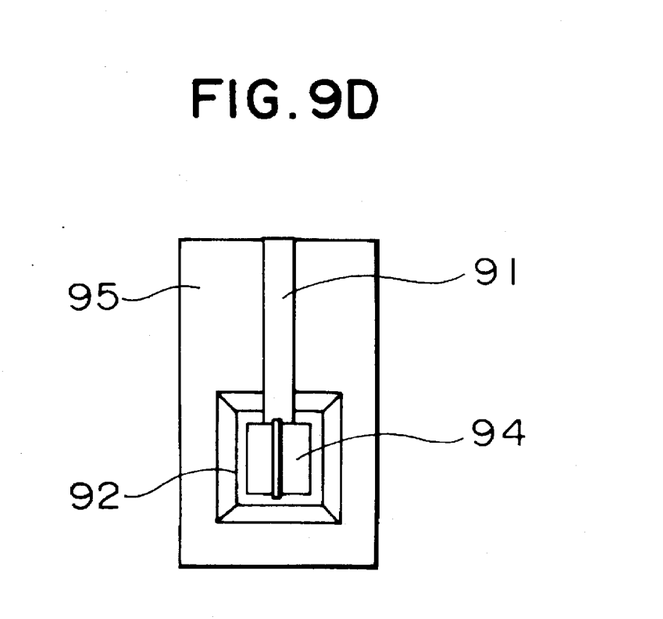

FIGS. 9A to 9D show a process of fabricating a plurality of optical modules of the present invention simultaneously. In FIG. 9A, optical waveguides 91 and recesses 92 are formed on a semiconductor wafer 93. Then, as shown in FIG. 9B, optical semiconductor chips 94 is disposed in the recesses 92 and the semiconductor wafer 93 and the optical semiconductor chips 94 are fixedly joined by solder bumps. The semiconductor wafer 93 is cut into individual chips along broken lines shown in FIG. 9C, so that the optical module of the present invention can be obtained as shown in FIG. 9D.

Since the process shown in FIG. 9 can be used to form the plurality of optical modules of the present invention simultaneously, the mass productivity can be improved. Further, since the optical semiconductor chips 94 and the optical waveguides 91 can be coupled without adjustment, the low-cost optical semiconductor device can be realized.

According to the present invention, the recesses are formed in the positions on the optical platform in which the optical semiconductor chips are fixedly joined to thereby be able to position the optical semiconductor chips without adjustment so that the optical semiconductor chips can be fixedly joined on the optical platform with high accuracy.

Further, according to the present invention, the sides of the recesses for fixedly joining the optical semiconductor chips are formed obliquely to thereby be able to reduce reflected light returned to the optical semiconductor chips and accordingly deterioration of the characteristics of the optical semiconductor chips due to the reflected light is prevented.

In addition, according to the present invention, the depth of the recesses is made deeper than the height of the unmelted solder bumps to thereby be able to limit the displacement of the optical semiconductor chips, the light emitting chips and the photodetectors until the solder bumps are melted after the optical semiconductor chips, the light emitting chips and the photodetectors are disposed on the optical platform and the optical semiconductor chips, the light emitting chips and the photodetectors can be fixedly joined to the optical platform by the self-alignment effect with high accuracy upon melting of the solder bumps.

What is claimed is:

1. An optical module comprising: an optical element mounting substrate in which a groove is formed, an optical fiber fixedly mounted in said groove, an optical semiconductor element fixedly mounted in said optical element mounting substrate, and a recess for fixing said optical semiconductor element in a position in a surface of said optical element mounting substrate in which an end surface of an active layer of said optical semiconductor element and an end surface of said optical fiber are coupled optically, two dimensional alignment of said optical semiconductor element being made by means of sides of said recess.

2. An optical module comprising: a plurality of optical semiconductor elements fixedly mounted on an optical element mounting substrate, and recesses each formed in a position in which end surfaces of active layers of said plurality of optical semiconductor elements are optically coupled with each other, two dimensional, alignment of said optical semiconductor elements being made by means of sides of said recesses.

3. An optical module according to claim 1, wherein spacing between the sides of said recess and respective side surfaces of said element is sufficient small to prevent two-dimensional position deviation of said element in said recess.

4. An optical module according to claim 1 to 2, comprising an electrode pattern formed within said recess to fixedly join at least solder bump.

5. An optical module according to claims 1 or 2, wherein when electrode patterns provided in said recess formed in said optical element mounting substrate and said optical semiconductor element are fixed by means of metal alloy member, a shape of said recess and a shape of the electrode pattern in said recess are matched within a range in which desired electrode patterns can be joined to each other.

6. An optical module according to claims 1 or 2, wherein the sides of said recess are inclined so that an area of an opening of said recess is made larger than an area of a bottom of said recess.

7. An optical module according to claims 1 or 2, further comprising: an electrode formed in a side of said recess and connected to an external electrode.

8. An optical module according to claim 7, further comprising: antireflection film formed in the side of said recess.

9. An optical module according to claims 7, wherein said optical element mounting substrate is made of semiconductor material and the side of said recess formed in a surface of said optical element mounting substrate is constituted of {111} surface.

10. An optical module according to claims 1 or 2, wherein a depth of said recess is 10 to 50 μm.

11. An optical module according to claims 1 or 2, wherein a length and a breadth of a bottom of said recess are larger than a length and a breadth of said optical semiconductor element, respectively, and are narrower than respective values obtained by adding 60 μm to the length and the breadth of said optical semiconductor.

12. An optical module according to claims 1 or 2, wherein said recess surrounds at least four corners of a bottom of said optical semiconductor element.

13. An optical module according to claims 1 or 2, wherein said recess surrounds at least four sides of a bottom of said optical semiconductor element.

14. An optical module according to claims 1 or 2, wherein said recess surrounds at least a set of opposite corners of said optical semiconductor element.

15. An optical module according to claims 1 or 2, wherein said recess surrounds at least corners at two ends of any one side of said optical semiconductor element and another side opposite to said one side.

16. An optical module according to claims 1 or 2, wherein said optical semiconductor element includes one of a photodiode or a laser diode.

17. An optical module comprising:
an optical element mounting substrate having an optical waveguide formed therein;
an optical semiconductor element fixedly mounted in said optical element mounting substrate, said element having a first electrode pattern; and
an recess, having a second electrode pattern, formed in said mounting substrate, said recess limiting two-dimensional deviation between said first electrode pattern and said second electrode pattern when said optical semiconductor element is fixedly mounted on said optical element mounting substrate, and limiting two-dimensional deviation of said element so that said element is in a position in a surface of said optical element mounting substrate to assure that an end surface of an active layer of said optical semiconductor element and an end surface of said optical waveguide are coupled optically.

18. An optical module according to claim 17, wherein said optical semiconductor element is fixed to said optical element mounting substrate by a metal alloy member disposed between said first and second electrode patterns, and wherein a shape of said recess and a shape of said second electrode pattern are matched to lie within a range in which said first electrode pattern can be joined with said second electrode pattern.

19. An optical module according to claim 17, wherein sides of said recess are inclined so that an area of an opening of said recess is made larger than an area of a bottom of said recess.

20. An optical module according to claim 17, further comprising:
an electrode formed in a side of said recess and connected to an external electrode.

21. An optical module according to claim 20, further comprising:
anti-reflection film formed in said side of said recess.

22. An optical module according to claim 20, wherein said optical element mounting substrate is made of semiconductor material and said side of said recess formed in a surface of said optical element mounting substrate is constituted of {111} surface.

23. An optical module according to claim 17, wherein a depth of said recess lies in a range between 10 and 50 microns.

24. An optical module according to claim 17, wherein a length and a breadth of a bottom of said recess are larger than a length and a breadth, respectively, of said optical semiconductor element, and are narrower than respective values obtained by adding 60 microns to each of the length and the breadth of said optical semiconductor element.

25. An optical module according to claim 17, wherein said recess surrounds at least four corners of a bottom of said optical semiconductor element.

26. An optical module according to claim 17, wherein said recess surrounds at least four sides of a bottom of said optical semiconductor element.

27. An optical module according to claim 17, wherein said recess surrounds at least a set of opposite corners of said optical semiconductor element.

28. An optical module according to claim 17, wherein said recess surrounds at least corners at two ends of any one side of said optical semiconductor element and another side opposite to said one side of said semiconductor optical element.

29. An optical module according to claim 17, wherein said optical semiconductor element includes one of a photodiode and a laser diode.

30. An optical module according to claim 17, wherein spacing between walls of said recess and respective side surfaces of said optical semiconductor element are sufficiently small to prevent two-dimensional position deviation of said element in said recess.

31. An optical module according to claim 17, wherein said first electrode pattern is coupled to said second electrode pattern by at least solder bumps.

32. An optical module according to claim 2, wherein sides of said recesses are inclined so that areas of openings of said recesses are made larger than areas of bottoms of said recesses.

33. An optical module according to claim 2, further comprising:

a plurality of electrodes formed in sides of respective ones of said recesses, said plurality of electrodes being connected, respectively, to a plurality of external electrodes.

34. An optical module according to claim 2, further comprising:

a plurality of anti-reflection films formed in sides of respective ones of said recesses.

35. An optical module according to claim 34, wherein said optical element mounting substrate is made of a semiconductor material and the sides of said recesses are constituted of a {111} surface.

36. An optical module according to claim 2, wherein depths of said recesses lie in a range of between 10 to 50 microns.

37. An optical module according to claim 2, wherein a length and a breadth of bottoms of each of said recesses are larger than a length and a breadth of respective ones of said optical semiconductor elements, and are narrower than respective values obtained by adding 60 microns to the length and the breadth of each of said optical semiconductor elements.

38. An optical module according to claim 2, wherein said recesses surround at least four corners of bottoms of respective ones of said optical semiconductor elements.

39. An optical module according to claim 2, wherein said recesses surround at least four sides of bottoms of respective ones of said optical semiconductor elements.

40. An optical module according to claim 2, wherein said recesses surround at least a set of opposite corners of respective ones of said optical semiconductor elements.

41. An optical module according to claim 2, wherein said recesses surround at least corners at two ends of any one side of respective ones of each of said optical semiconductor elements and another side opposite to said one side of respective ones of said optical semiconductor elements.

42. An optical module according to claim 2, wherein said optical semiconductor elements include one of a photodiode and a laser diode.

43. An optical module according to claim 2, further comprising:

a plurality of electrode patterns formed, respectively, within said recesses; and a plurality of electrode patterns formed, respectively, on each of said optical semiconductor elements, said plurality of electrode patterns on each of said optical semiconductor elements being fixedly joined to respective ones of said plurality of electrode patterns within said recesses by means of solder bumps.

44. An optical module according to claim 2, wherein electrode patterns are provided in each of said recesses formed in said optical element mounting substrate and on each of said optical semiconductor elements, and wherein a shape of said recesses and a shape of the electrode patterns in said recesses are matched to lie within a range that permits said electrode patterns of said recesses and said optical semiconductor elements to be joined, respectively, by means of metal alloy members.

45. A method for fabricating an optical module, comprising the steps of:

etching a recess in a surface of said optical element mounting platform, said recess having lateral dimensions larger than lateral dimensions of an optical semiconductor element;

forming an electrode pattern at a bottom surface of said recess;

placing solder bumps on an electrode pattern formed on a bottom surface of said optical semiconductor element; and placing said optical semiconductor element with said solder bumps into said recess so that the electrode pattern of said optical semiconductor element is fixed to the electrode pattern in said bottom surface of said recess by means of said solder bumps, walls of said recess limiting two-dimensional deviation between coupling of said first and second electrode patterns.

46. The method recited in claim 45, further comprising the steps of:

etching a groove in a surface of an optical element mounting platform, said groove being in communication with said recess, the walls of said recess limiting two-dimensional deviation of said element so that said element is in a position to assure that an end surface of an active layer of said optical semiconductor element and an end surface of an optical waveguide disposed in said groove are optically coupled.

47. The method recited in claim 45, wherein the walls of said recess are formed at an oblique angle with respect to the bottom surface of said recess.

48. A method for fabricating an optical module, comprising the steps of:

etching a groove in a surface of an optical element mounting platform;

etching a recess in a surface of said optical element mounting platform, said recess being in communication with said groove and having lateral dimensions larger than lateral dimensions of an optical semiconductor element; and fixing said optical semiconductor element to a bottom surface of said recess by means of solder bumps, walls of said recess preventing two-dimensional deviation of said optical semiconductor element so that said optical semiconductor element resides in a position in said recess so that an end surface of an active layer of said optical semiconductor element and an end surface of an optical waveguide disposed in said groove are optically coupled.

* * * * *